United States Patent
Lim (10) Patent No.: US 10,770,005 B2
(45) Date of Patent: *Sep. 8, 2020

(54) DISPLAY DEVICE

(71) Applicant: LG Display Co., Ltd., Seoul (KR)

(72) Inventor: SangHyun Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,581

(22) Filed: Dec. 10, 2018

(65) Prior Publication Data

US 2019/0180694 A1 Jun. 13, 2019

(30) Foreign Application Priority Data

Dec. 11, 2017 (KR) .......................... 10-2017-0169425

(51) Int. Cl.
*G09G 3/3275* (2016.01)
*H01L 27/32* (2006.01)
(Continued)

(52) U.S. Cl.
CPC ..... *G09G 3/3275* (2013.01); *G02F 1/136209* (2013.01); *G02F 1/136286* (2013.01); *G06F 3/04164* (2019.05); *G09G 3/3225* (2013.01); *H01L 27/124* (2013.01); *H01L 27/3272* (2013.01); *H01L 27/3276* (2013.01);
(Continued)

(58) Field of Classification Search
CPC ... G09G 2300/0426; G09G 2320/0223; G09G 3/3266; G09G 3/3275; G09G 3/3225; G09G 3/3666; G09G 2310/0232; H01L 27/3276; H01L 27/124; H01L 27/098; H01L 27/1218; H01L 27/3297; H01L 27/3244; G02F 1/136286; G02F 1/1333; G02F 1/134309; G02F 2201/56; G06F 3/044; G06F 3/04164; G06F 3/0412; G06F 3/0416; G06F 1/16
See application file for complete search history.

(56) References Cited

U.S. PATENT DOCUMENTS 10,062,317 B2 * 8/2018 Kim ...................... H01L 27/124
10,192,938 B2 * 1/2019 Yu ......................... G09G 3/3266
(Continued)

FOREIGN PATENT DOCUMENTS

EP          3 232 431 A1    10/2017
WO    WO 2017/172375 A1    10/2017

OTHER PUBLICATIONS

European Patent Office, Extended European Search Report and Opinion, EP Patent Application No. 18211263.1, dated Mar. 22, 2019, 17 pages.

*Primary Examiner* — Dismery Mercedes
(74) *Attorney, Agent, or Firm* — Fenwick & West LLP (57) ABSTRACT

A display device according to the present disclosure includes a substrate including a display area which has an irregularly shaped side and a non-display area which includes a notch area defined by a shape of the irregularly shaped side of the display area and is disposed to enclose the display area. A load amount of the scan output signal of the display area in which the irregularly shaped side is formed is detected by a plurality of sensing lines and an offset of a data signal is corrected based on the load amount to improve an image quality of the display device including an irregularly shaped side.

14 Claims, 9 Drawing Sheets

(51) Int. Cl.
  *H01L 27/12* (2006.01)
  *G02F 1/1362* (2006.01)
  *G09G 3/3225* (2016.01)
  *G06F 3/041* (2006.01)
  *G09G 3/3266* (2016.01)
  *G09G 3/36* (2006.01)

(52) U.S. Cl.
  CPC ......... *G09G 3/3266* (2013.01); *G09G 3/3677* (2013.01); *G09G 3/3688* (2013.01); *G09G 2300/0426* (2013.01); *G09G 2310/0221* (2013.01); *G09G 2310/0232* (2013.01); *G09G 2310/0243* (2013.01); *G09G 2310/08* (2013.01); *G09G 2320/0223* (2013.01); *G09G 2320/0233* (2013.01); *G09G 2320/0673* (2013.01); *G09G 2330/12* (2013.01)

(56) References Cited

U.S. PATENT DOCUMENTS

| | | | |
|---|---|---|---|
| 10,290,694 B2 * | 5/2019 | Xiang | H01L 27/3225 |
| 10,360,862 B2 * | 7/2019 | Yeh | G09G 3/3666 |
| 10,403,193 B2 * | 9/2019 | Kim | H01L 27/3223 |
| 10,559,253 B1 * | 2/2020 | Li | H01L 27/124 |
| 10,573,236 B1 * | 2/2020 | Gao | G09G 3/3233 |
| 10,644,038 B2 * | 5/2020 | Wang | H01L 27/124 |
| 2005/0225690 A1 * | 10/2005 | Battersby | G09G 5/005 349/41 |
| 2013/0147856 A1 | 6/2013 | Chou et al. | |
| 2014/0152921 A1 * | 6/2014 | Yashiro | G06F 3/044 349/12 |
| 2017/0301280 A1 * | 10/2017 | Ka | G09G 3/3406 |
| 2018/0129111 A1 * | 5/2018 | Wu | G02F 1/13338 |
| 2018/0219058 A1 * | 8/2018 | Xiang | H01L 27/3225 |
| 2019/0056819 A1 * | 2/2019 | Moon | G06F 3/044 |
| 2019/0073976 A1 * | 3/2019 | Yeh | G02F 1/136286 |
| 2019/0079625 A1 * | 3/2019 | Wang | G06F 3/0412 |
| 2019/0080648 A1 * | 3/2019 | Hwang | G09G 3/3266 |
| 2019/0164484 A1 * | 5/2019 | Yeo | G09G 3/3291 |
| 2019/0164489 A1 * | 5/2019 | Zhang | G09G 3/3258 |
| 2019/0181213 A1 * | 6/2019 | Lim | H01L 27/3246 |

\* cited by examiner

| GIP | Time | TABLE OF Tr/Tf CHANGE OF NOTCH AREA ||||||| 
|---|---|---|---|---|---|---|---|---|
| | | Ref. | Notch A | Notch B | Notch C | Notch D | Notch E | Notch F |
| SCAN | Tr(us) | 1.20 | 1.04 | 0.96 | 0.91 | 0.88 | 0.85 | 0.82 |
| | Tf(us) | 1.37 | 1.19 | 1.06 | 0.99 | 0.94 | 0.90 | 0.86 |
| | Tr+Tf | 2.57 | 2.23 | 2.02 | 1.90 | 1.82 | 1.75 | 1.68 |
| | Tr−Tf | 0.17 | 0.15 | 0.10 | 0.08 | 0.06 | 0.05 | 0.04 |

DISPLAY DEVICE

CROSS-REFERENCE TO RELATED APPLICATIONS

This application claims priority to Republic of Korea Patent Application No. 10-2017-0169425 filed on Dec. 11, 2017, in the Korean Intellectual Property Office, the disclosure of which is incorporated herein by reference in its entirety.

BACKGROUND

Field of the Technology

The present disclosure relates to a display device, and more particularly, to a display device having an irregularly shaped structure.

Description of the Related Art

Various display devices are currently being developed and marketed. For example, there are display devices such as a liquid crystal display device (LCD), a field emission display device (FED), an electro phoretic display device (EPD), an electro-wetting display device (EWD), an organic light emitting display device (OLED), and a quantum dot display device (QD).

A display device includes a display area in which a plurality of pixels is disposed to implement images and a non-display area which encloses the display area. In the non-display area, images are not implemented. In this case, in the display area, a plurality of pixels may be defined. Further, in the non-display area, wiring lines and circuits for transmitting various signals to the plurality of pixels are disposed.

As the technology for implementing such a display device has been developed and a large number of products have been mass-produced, technologies for implementing a design desired by a consumer have been mainly developed for the display device. One of them is a variation of a shape of a display area in which the image is implemented. Specifically, various shapes of the display area are required other than a rectangular shape.

SUMMARY

The present disclosure relates to a difference between a scan load of a display device with an irregularly shaped structure. That is, a scan load of a display area having an irregularly shaped side differs from a scan load of a display area which does not have an irregularly shaped side, which causes a sampling voltage difference to deteriorate a display quality of the display device.

The present disclosure relates to a display device having a novel structure for solving the problems caused by a scan load difference which may be generated in the display device having an irregularly shaped.

Specifically, an object to be achieved by the present disclosure is to provide a display device which corrects an offset when a scan load amount of a display area having an irregularly shaped side is detected and data is output based on the detected result to reduce a sampling voltage difference, thereby minimizing deterioration of a display quality of the display device.

Objects of the present disclosure are not limited to the above-mentioned objects, and other objects, which are not mentioned above, can be clearly understood by those skilled in the art from the following descriptions.

According to an aspect of the present disclosure, a display device includes: a substrate which includes a display area having an irregularly shaped side and a non-display area which includes a notch area defined by a shape of the irregularly shaped side and is disposed to enclose the display area, a plurality of gate lines which is divided to be disposed in a left display area and a right display area due to the irregularly shaped side of the display area, a plurality of data lines disposed in the display area; and a plurality of sensing lines which is disposed in the notch area and is connected to the plurality of gate lines to transmit a scan output signal output from the plurality of gate lines. Therefore, according to the present disclosure, the plurality of sensing lines is formed in the notch area so that the load amount of the scan output signal of the display area in which an irregularly shaped side is formed may be easily detected.

According to another aspect of the present disclosure, a display device includes a display panel which includes a display area with a plurality of pixels to display images and a non-display area disposed to enclose the display area, which in the display area includes a plurality of gate lines extending in a first direction and having different lengths and a plurality of data lines extending in a second direction which is different from the first direction, a load detecting unit which detects a scan load amount difference due to a length difference of the gate lines and quantifies and outputs the scan load amount difference, and a data driver which corrects an offset of the data signal applied to the plurality of data lines based on an output value output from the load detecting unit and outputs the corrected data signal. Therefore, according to the present disclosure, a scan load amount of the plurality of gate lines having different lengths disposed in the display panel is detected and a load amount is quantified based on the scan load amount, and then the offset of the data signal is corrected, thereby improving an image quality of a display device having the irregularly shaped side.

Other detailed matters of the embodiments are included in the detailed description and the drawings.

According to the present disclosure, a plurality of sensing lines which is routed to gate lines of the display area is disposed in a notch area formed as an irregularly shaped side so that a scan load difference of the display area due to the irregularly shaped side may be easily detected without significantly affecting a bezel size.

According to the present disclosure, a scan load difference of a display area due to an irregularly shaped side is detected and the detected scan load difference is quantified to correct an offset of a data signal based on the quantified value, thereby improving a display quality of a display device.

According to the present disclosure, sensing lines disposed in a notch area is formed of the same material on the same layer as a light blocking layer of a pixel disposed in the display area, thereby easily disposing the sensing lines without adding a mask process step.

The effects according to the present disclosure are not limited to the contents exemplified above, and various additional effects are included in the present disclosure.

BRIEF DESCRIPTION OF THE DRAWINGS

The above and other aspects, features, and other advantages of the present disclosure will be more clearly understood from the following detailed description taken in conjunction with the accompanying drawings.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the following exemplary embodiments but may be implemented in various different forms. The exemplary embodiments are provided only to complete disclosure of the present disclosure and to fully provide a category of the disclosure to a person having ordinary skill in the art to which the present disclosure pertains, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular forms may include plural forms unless expressly stated otherwise.

Components are interpreted to include an error range even if not expressly stated.

When the position relation between two parts is described using the terms such as "on", "above", "below", and "next", one or more parts may be positioned between the two parts, unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not limited by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawings are illustrated for the convenience of description, and the present disclosure is not limited to the size and the thickness of the components illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings.

Figure 1:
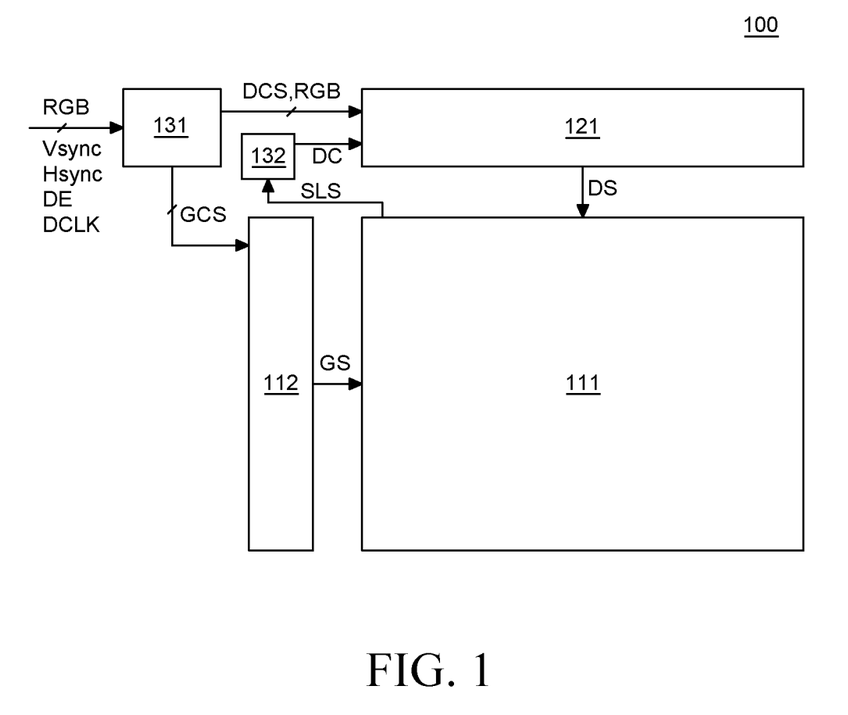
FIG. 1 is a block diagram of a display device according to an exemplary embodiment of the present disclosure.

FIG. 1 is a block diagram of a display device according to an exemplary embodiment of the present disclosure.

Referring to FIG. 1, a display device 100 according to an exemplary embodiment of the present disclosure includes a substrate 111, a gate driver 112, a data driver 121, a timing controller 131, and a load detecting unit 132.

The substrate 111 supports and protects various components of the display device 100. On the substrate 111, a plurality of pixels for displaying images and a driving element for driving the plurality of pixels are disposed. Even though the substrate 111 is generally disposed to have a rectangle shape having four sides, the substrate 111 according to an exemplary embodiment of the present disclosure may be configured with irregularly shaped sides, in which one of the four sides has an irregularly shaped structure. The term "irregular shape" in the present application may be intended to describe a shape of the display that is different from the conventionally-known square or rectangular types. The structure of the substrate 111 as described above will be described in detail with reference to FIG. 2.

The gate driver 112 supplies gate signals GS to the pixels disposed on the substrate 111 in accordance with a gate driving control signal GCS transmitted from the timing controller 131. The gate driver 112 may include a shift register or a level shifter. The gate driver 112 may be embedded on a non-display area of the substrate 111, in which pixels are not disposed, by a gate in panel (GIP) manner at the time of manufacturing the substrate 111, which will be described below with reference to FIG. 2. However, a mounting type of the gate driver 112 is not limited to the GIP manner as described in one exemplary embodiment of the present disclosure, but the gate driver 112 may be disposed independently from the substrate 111.

The data driver 121 generates a sampling signal by a data driving control signal DCS transmitted from the timing controller 131 and changes the image data into a data signal DS by latching image data input from the timing controller 131 in accordance with the sampling signal, and then supplies the data signal DS to the pixels disposed on the substrate 111 in response to a source output enable (SOE) signal. The data driver 121 corrects the offset of the data signal based on a scan load value of the gate line detected by the load detecting unit 132 to output a data signal. The data driver 121 may be disposed by a chip on film (COF) manner, which will be described below with reference to FIG. 2. However, a mounting type of the data driver 121 is not limited to the chip on film type as described in the exemplary embodiment of the present disclosure, but the data driver 121 may be connected to a bonding pad of the substrate 111 by a chip on glass (COG) manner or may be disposed directly on the substrate 111. In some cases, the data driver 121 may be integrated to be disposed on the substrate 111.

The timing controller 131 transmits input image signal RGB received from a host system to the data driver 121. The timing controller 131 generates a timing control signal for controlling an operation timing of the data driver 121 and the gate driver 112 using timing signals such as a clock signal DCLK, a horizontal synchronization signal Hsync, a vertical synchronization signal Vsync, and a data enable signal DE which are received together with the input image signal RGB. The timing controller 131 is synchronized with the timing signal to generate a data driving control signal DCS of the data driver 121 and a gate driving control signal GCS of the gate driver 112.

The load detecting unit 132 detects a load difference of the gate line which is generated in accordance with a design of a display area of the substrate 111 including an irregularly shaped side and transmits the difference to the data driver 121. The detailed structure of the load detecting unit 132 will be described in detail with reference to FIG. 7.

Figure 2:
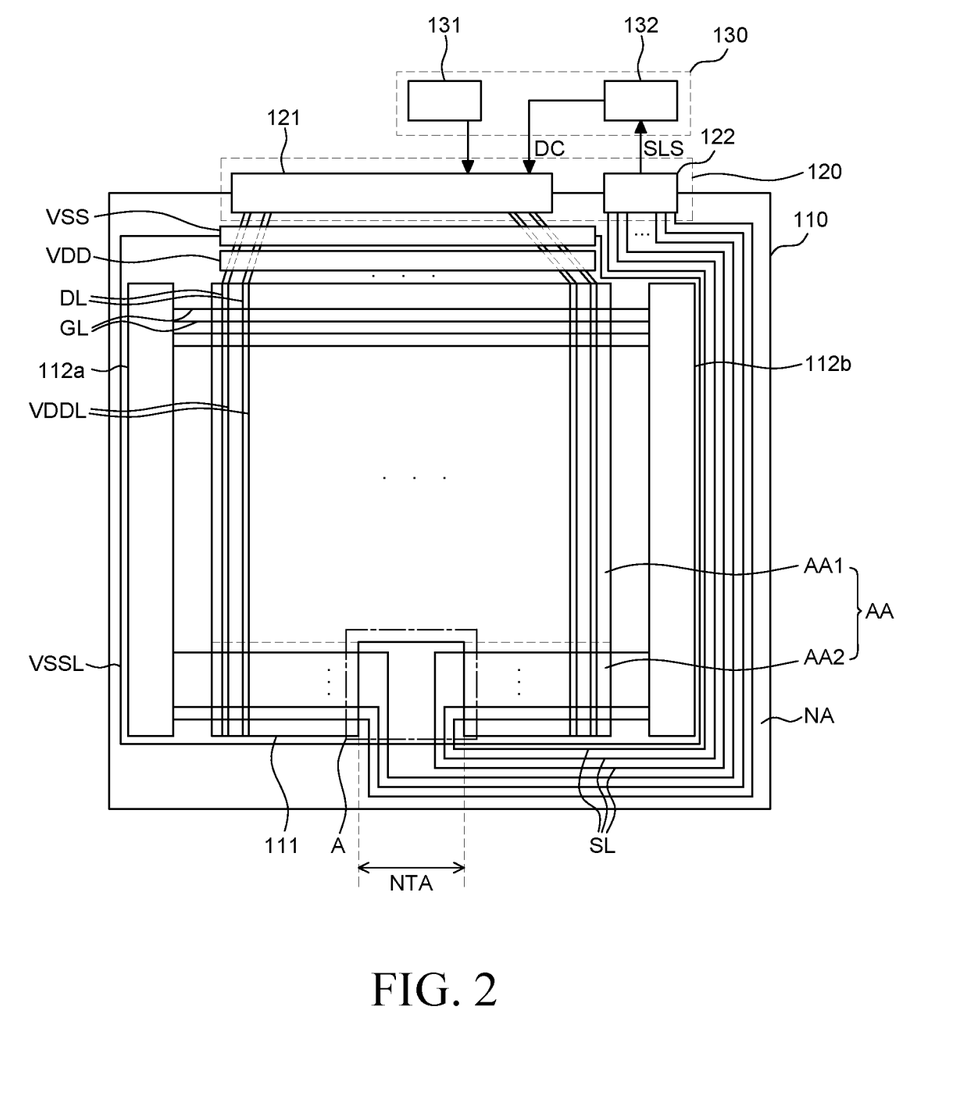
FIG. 2 is a plan view of a display device according to an exemplary embodiment of the present disclosure.

FIG. 2 is a plan view of a display device according to an exemplary embodiment of the present disclosure.

Referring to FIG. 2, the display device 100 according to the exemplary embodiment of the present disclosure includes a display panel 110, a flexible film 120, and a printed circuit board 130.

The display panel 110 includes the substrate 111, a first gate driver 112a, a second gate driver 112b, a high-potential power supply unit VDD, a low-potential power supply unit VSS, a gate line GL, a data line DL, a high-potential power line VDDL, and a low-potential power line VSSL.

The substrate 111 supports and protects various components of the display device 100, and the substrate 111 may be formed of glass or a plastic material having flexibility. When the substrate 111 is formed of a plastic material, for example, the substrate 111 may be formed of polyimide (PI), but, is not limited thereto.

In the substrate 111, the display area AA and the non-display area NA enclosing the display area AA may be defined.

The display area AA is an area in which an image is displayed in the display device 100. A display unit, various driving elements for driving the display unit, and signal lines are disposed in the display area AA. For example, the display unit may be an organic light emitting display unit which is configured by an organic light emitting diode including an anode, an organic light emitting layer, and a cathode. However, the display unit is not limited thereto, but may be a liquid crystal display unit which drives liquid crystals by an electric field generated by a voltage applied to a pixel electrode and a common electrode. Further, various driving elements for driving the display unit, such as thin film transistors or capacitors, may be disposed in the display area AA. Furthermore, as illustrated in FIG. 2, a plurality of signal lines such as gate lines GL or data lines DL may be disposed in the display area AA.

A plurality of pixels is disposed in the display area AA. Each of the plurality of pixels is a minimum unit which emits light and includes a red pixel, a green pixel, and a blue pixel. The plurality of pixels may further include a white pixel. Each of the plurality of pixels of the display area AA may be connected to the gate line GL and the data line DL.

Referring to FIG. 2, in the display area AA, one of four sides which form the display area AA may be an irregularly shaped side having an irregularly shaped structure. Here, the irregularly shaped side may be one of upper, lower, left, or right sides. The irregularly shaped side means a side having a curved shape, rather than a straight side. Further, in the exemplary embodiment of the present disclosure, the irregularly shaped structure is a structure generated by an irregularly shaped side. The irregularly shaped structure may refer to an irregularly shaped formed by deformation of a polygon such as a circle, a triangle, a rectangle, a rhombus, a pentagon, or a hexagon so that it is difficult to be defined as a general polygon. The irregularly shaped structure may also refer to a shape in which the pixel is not disposed in the display area AA, so that when an image is displayed, an area in which the pixel is not disposed is visually recognized.

Referring to FIG. 2, a lower side of the display area AA is an irregularly shaped side. In the exemplary embodiment of the present disclosure, an upper area of the display area which does not include an irregularly shaped side is referred to as a first display area AA1, and a lower area of the display area AA which includes an irregularly shaped side is referred to as a second display area AA2. That is, the second display area AA2 is divided into a left second display area and a right second display area by an irregularly shaped side disposed at a center portion of the second display area AA2.

The irregularly shaped side of the second display area AA2 is inwardly recessed toward an upward direction of the display area AA so that an irregularly shaped structure having a concave shape corresponding to the irregularly shaped side may be defined. Since pixels are not disposed in a position of the second display area AA2 where the irregularly shaped side is recessed, images are not displayed where the irregularly shaped side is recessed. Therefore, the position may be defined as a notch area NTA. Therefore, a display size of the second display area AA2 may be different from a display size of the first display area AA1. That is, the display size of the second display area AA2 may be smaller than the display size of the first display area AA1.

Since the images are not displayed in the notch area NTA, the notch area may be included as a part of the non-display area NA. In the notch area NTA formed by a recessed irregularly shaped side, physical components, for example a button, a speaker, or a switch, are disposed to implement other functions of the display device 100. Specifically, since one of four sides of the display area AA is configured as an irregularly shaped side having an irregularly shaped structure, a length of the gate line GL according to an exemplary embodiment of the present disclosure which is disposed in the first display area AA1 without having an irregularly shaped structure and a length of the gate line which is disposed in the second display area AA2 having an irregularly shaped structure are different from each other. Therefore, there may be a difference in load amounts of the gate lines GL. In order to compensate the difference, the gate line GL disposed in the second display area AA2 extends to the notch area NTA which is an irregularly shaped structure area in the second display area AA2. In the notch area NTA, the gate line GL may be routed to be connected to the sensing line SL disposed in the notch area NTA. The sensing line SL may transmit a load amount of the gate line GL disposed in the second display area AA2 to the load detecting unit 132. The sensing line SL may be disposed to be closer to the substrate 111 than the gate line GL.

In FIG. 2, as a modified example of the rectangular display area AA, a shape in which a part of one side of the rectangle is recessed is illustrated, but is not limited thereto and may be implemented by various shapes. For example, a plurality of sides of the display area AA may be implemented as irregularly shaped sides or holes having various shapes may be formed in the display area AA. In the area of the holes, pixels are not disposed so that images are not displayed. Therefore, the area in the holes may be included in the non-display area NA.

The non-display area NA is an area where images are not displayed so that the non-display area NA may be defined as an area enclosing the display area AA. Various components for driving the plurality of pixels disposed in the display area AA may be disposed in the non-display area NA. For example, as illustrated in FIG. 2, first and second gate drivers 112a and 112b, a flexible film 120, a high-potential power supply unit VDD, and a low-potential power supply unit VSS may be disposed in the non-display area NA of the substrate 111. Further, as described above, since the display area AA has an irregularly shaped structure, the non-display area NA also has an irregularly shaped structure. That is, as illustrated in FIG. 2, the non-display area NA also has a shape according to the irregularly shaped structure of the display area AA and this area may be referred to as a notch area NTA.

The first and second gate drivers 112a and 112b output the gate signal GS to the plurality of gate lines GL of the display area AA based on the gate driving control signal GCS output from the timing controller 131 and selects a pixel to which a data voltage is charged.

The high-potential power supply unit VDD is supplied with a high-potential voltage from the data driver 121 to transmit the high-potential voltage to the high-potential power supply line VDDL of the display area AA. The high-potential power supply unit VDD is connected to the high-potential power supply line VDDL. A plurality of high-potential power supply lines VDDL is disposed in the display area AA. The plurality of high-potential power supply lines VDDL is lines for transmitting a high-potential voltage to each pixel of the display area AA. Each of the plurality of high-potential power supply lines VDDL is connected to the high-potential power supply unit VDD.

The low-potential power supply unit VSS is supplied with a low-potential voltage from the data driver 121 to transmit the low-potential voltage to each pixel. The low-potential power supply unit VSS is connected to the low-potential power supply line VSSL. Referring to FIG. 2, the low-potential power supply line VSSL is integrally formed to enclose the display area AA. In the present disclosure, although it is illustrated that the low-potential power supply line VSSL encloses the display area AA, it is not limited thereto. For example, the low-potential power supply line VSSL may be disposed so as to transmit the low-potential voltage from the low-potential power supply unit VSS to each pixel.

The high-potential power supply line VDDL and the low-potential power supply line VSSL may be formed of the same material. For example, the high-potential power supply line VDDL and the low-potential power supply line VSSL may be formed of the same material as the source electrode and the drain electrode of the thin film transistor disposed in the display area AA. Although in the exemplary embodiment of the present disclosure, it is described that the high-potential power supply line VDDL and the low-potential power supply line VSSL are formed of the same material, it is not limited thereto. For example, the high-potential power supply line VDDL is formed of the same material as the source electrode and the drain electrode of the thin film transistor disposed in the display area AA. The low-potential power supply line VSSL is formed of the same material as the gate electrode of the thin film transistor disposed in the display area AA.

A plurality of data lines DL is disposed in the display area AA. The plurality of data lines DL is for transmitting a data voltage to each pixel of the display area AA. The plurality of data lines DL is connected to the data driver 121 via a data link line.

The data driver 121 outputs a data signal DS to the data line DL of the display area AA, based on the data driving control signal DCS transmitted from the timing controller 131 and a scan load amount difference quantified by the load detecting unit 132. As illustrated in FIG. 2, the data driver 121 may be included in the flexible film 120 or may be disposed as a chip on film type. Even though not specifically illustrated in FIG. 2, the chip on film type refers to a structure in which a data driving chip is disposed on a flexible base film. The chip-on-film type data driver 121 is disposed to be electrically connected to a data driving pad (not illustrated) disposed on the substrate 111 and may be electrically connected to the display panel 110 and a printed circuit board 130 disposed at the outside through the plurality of signal lines disposed on the base film. By doing this, the data driver 121 may correct the offset of the data signal DS and output the corrected data signal based on the detected scan load value output from the load detecting unit 132 disposed on the printed circuit board 130.

The flexible film 120 may include a signal transmitting film 122. The signal transmitting film 122 is electrically connected to the sensing line SL which extends from the second display area AA2 in the notch area NTA to transmit the load detecting signal SLS, which is input from the sensing line SL, to the load detecting unit 132.

The printed circuit board 130 includes the timing controller 131 and the load detecting unit 132.

The timing controller 131 generates and transmits the image signal RGB and the data driving control signal DCS, which are received from the external host system, to the data driver 121. Further, the timing controller 131 generates the gate driving control signal GCS to transmit the gate driving control signal GCS to the first and second gate drivers 112a and 112b.

The load detecting unit 132 receives a scan output signal, that is a scan load signal, of a pixel disposed in the second display area AA2 through the sensing line SL disposed in the notch area NTA. The load detecting unit 132 quantifies the scan load amount of the scan output signal based on the scan load signal SLS and outputs the scan load amount to the data driver 121. More specifically, the load detecting unit 132 calculates a rising time and a falling time of the scan output signal of each pixel connected to the gate line GL disposed in the second display area AA2 and quantifies and outputs the calculated rising time and falling time. The data driver 121 may correct the offset of the data signal by comparing a predetermined reference value and the output value. The load detecting unit 132 will be described in more detail with reference to FIG. 7.

Figure 3A:
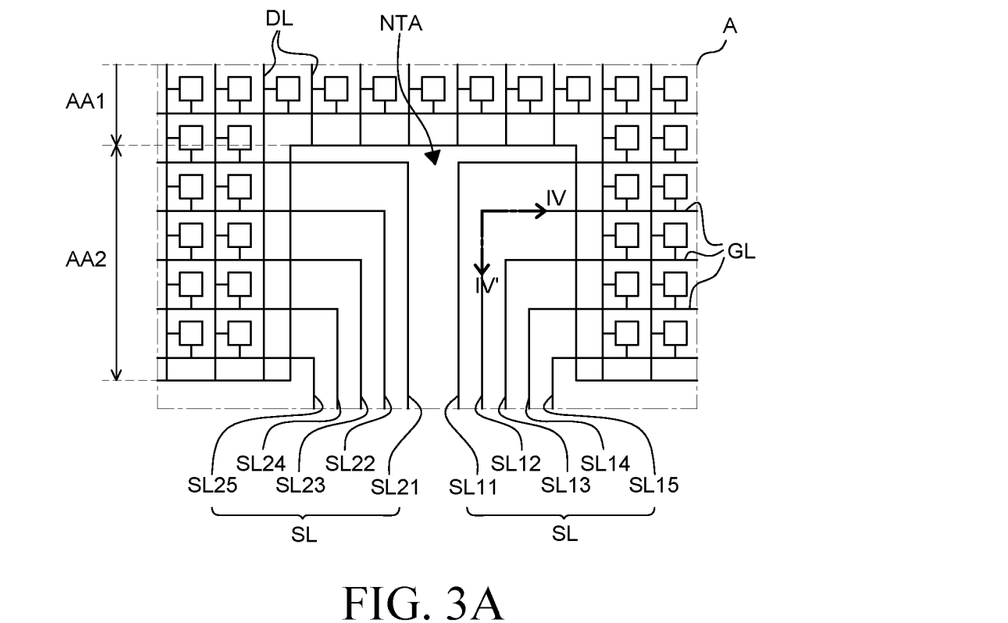
FIG. 3A is an enlarged view of an area A of FIG. 2.
Figure 3B:
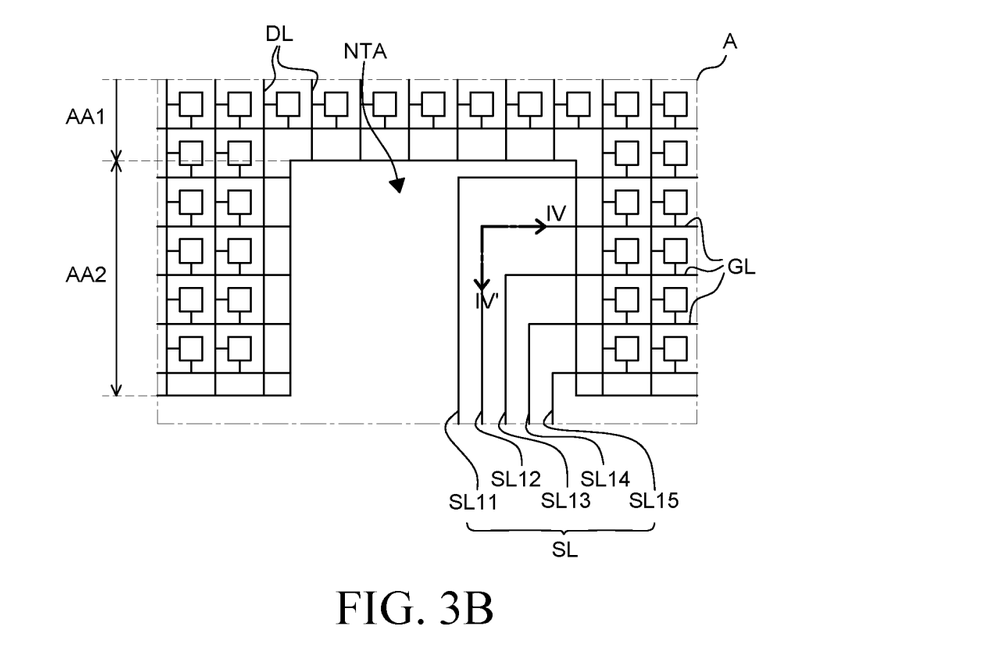
FIG. 3B is an enlarged view of an area A of FIG. 2, according to another exemplary embodiment.
Figure 4A:
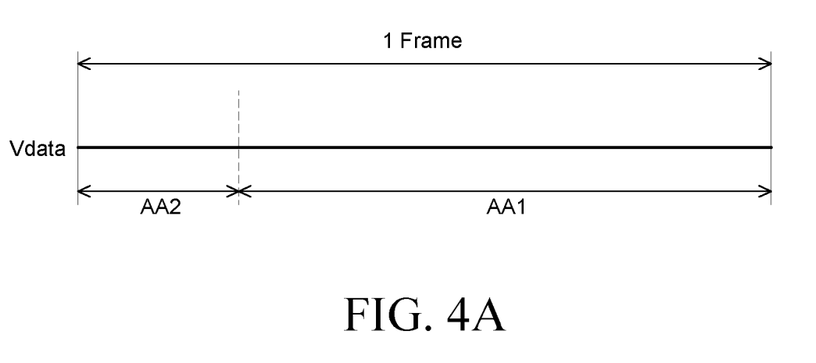
FIG. 4A is a comparative example of applying a data voltage of a display device according to an exemplary embodiment of the present disclosure.
Figure 4B:
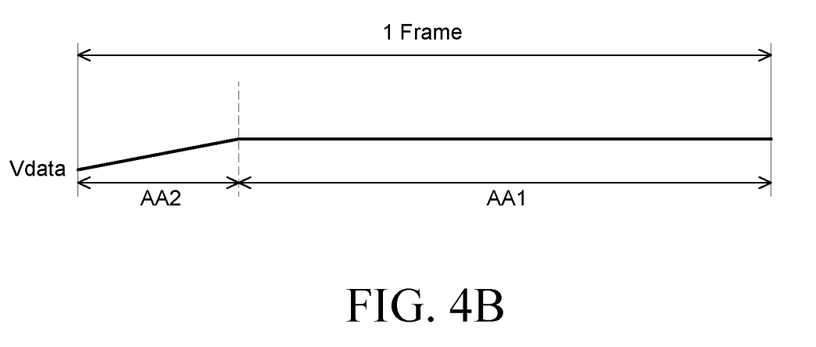
FIG. 4B is an example of applying a data voltage of a display device according to an exemplary embodiment of the present disclosure.

FIG. 3A is an enlarged view of an area A of FIG. 2. FIG. 3B is an enlarged view of an area A of FIG. 2, according to another exemplary embodiment. FIG. 4A is a comparative example of a data voltage of a display device according to an exemplary embodiment of the present disclosure. FIG. 4B is an example of applying a data voltage of a display device according to an exemplary embodiment of the present disclosure.

First, referring to FIG. 3A, a second display area AA2 of the display area AA of the substrate 111 according to an exemplary embodiment of the present disclosure has a concave portion defined by an irregularly shaped side. That is, as illustrated in FIG. 3A, the second display area AA2 of the display area AA may have a notch area NTA which is inwardly recessed.

The gate lines GL disposed in the second display area AA2 is shorter than the gate lines GL disposed in the first display area AA1, due to the notch area NTA. By doing this, there may be a difference between the scan load amount of the first display area AA1 and the scan load amount of the second display area AA2. However, generally, the data signal DS output from the data driver 121 is equally applied to the first display area AA1 and the second display area AA2, as illustrated in FIG. 4A. Therefore, the luminance of the first display area AA1 and the luminance of the second display area AA2 may be different from each other depending on the difference of the scan loads. More specifically, the luminance of the second display area AA2 is lower than the luminance of the first display area AA1 so as to be visually recognized as a stain.

Therefore, in the notch area NTA according to the exemplary embodiment of the present disclosure, a plurality of sensing lines SL is disposed to detect the scan loads of the plurality of gate lines GL disposed in the second display area AA2.

The plurality of sensing lines SL extends to the notch area NTA from the second display area AA2 to be connected to the plurality of gate lines GL in the notch area NTA. The plurality of sensing lines SL may electrically connect the plurality of gate lines GL disposed in the second display area AA2 and the signal transmitting film 122. Therefore, the plurality of sensing lines SL transmits the scan load amount, which is detected through the scan output signal output from the plurality of gate lines GL disposed in the second display area AA2, to the load detecting unit 132. The scan load amount of the second display area AA2 is quantified based on the scan load amount transmitted as described above and the offset of the data signal is provided based on the quantified scan load amount of the second display area AA2. Therefore, as illustrated in FIG. 4B, the display device 100 according to the exemplary embodiment of the present disclosure may apply different data voltages Vdata to the first display area AA1 and the second display area AA2, respectively, to improve the display quality of the display device 100. As illustrated in FIG. 3A, the plurality of sensing lines SL may be disposed so as to correspond to the plurality of gate lines GL disposed in the second display area AA2. The second display area AA2 is divided into a left second display area AA2 and a right second display area AA2 by the notch area NTA. The plurality of sensing lines SL, including sensing lines SL11, SL12, SL13, SL14, SL15, SL21, SL22, SL23, SL24, and SL25, may be connected to a plurality of gate lines extending from the left second display area AA2 and a plurality of gate lines extending from the right second display area AA2. In this case, the plurality of gate lines disposed in the second display area AA2 may be connected to correspond to the plurality of sensing lines SL. Even though, in FIG. 2, the plurality of sensing lines SL is disposed on only one side of the non-display area NA, it is not limited thereto. For example, when the signal transmitting film 122 which is electrically connected to the plurality of sensing lines SL is disposed on both sides of the data driver 121, the plurality of sensing lines SL is also disposed to extend to both sides of the non-display area NA.

In the meantime, when the notch area NTA is located at a center portion of the second display area AA2 so that the left second display area AA2 and the right second display area AA2 are formed to have the same width, the plurality of gate lines disposed in the left second display area AA2 and the plurality of gate lines disposed in the right second display area AA2 may have the same length. In this case, in the display device 100 according to the exemplary embodiment of the present disclosure, the plurality of gate lines disposed in the left second display area AA2 and the plurality of gate lines disposed in the right second display area AA2 have the same scan load. Therefore, as illustrated in FIG. 3B, only the plurality of gate lines disposed in one of the left and right second display areas AA2 is electrically connected to the sensing lines SL, including sensing lines SL11, SL12, SL13, SL14, SL15. As illustrated in FIG. 3B, when the sensing line SL is connected only to the gate lines disposed in the right second display area between the left second display area and the right second display area, a size of the non-display area, that is, a size of a bezel area of the display area may be reduced as compared with FIG. 3A in which the sensing line is connected to both the left and right second display areas.

A pixel structure and a detailed structure of a notch area of the display device according to an exemplary embodiment of the present disclosure will be described with reference to FIGS. 5 and 6.

Figure 5:
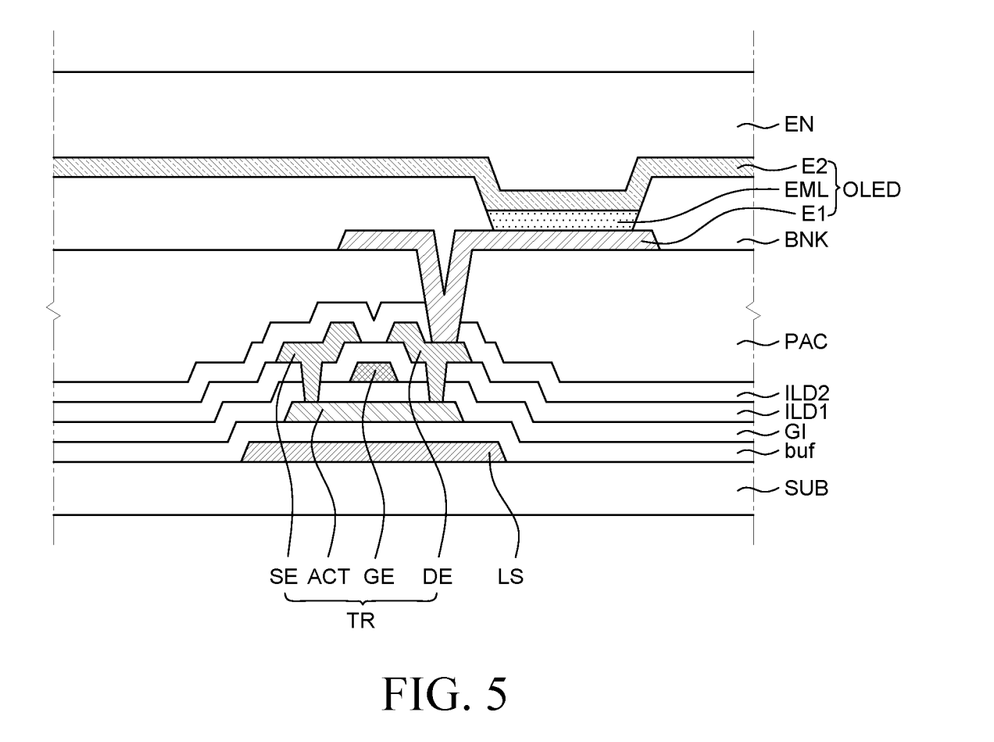
FIG. 5 is a cross-sectional view of a pixel structure of a display device according to another exemplary embodiment of the present disclosure.

FIG. 5 is a cross-sectional view of a pixel structure of a display device according to an exemplary embodiment of the present disclosure. Even though it has been described that the pixel of the display device of the present disclosure includes an organic light emitting diode (OLED), it is not limited thereto. As described above, the pixel may include a liquid crystal element.

Referring to FIG. 5, the pixel according to an exemplary embodiment of the present disclosure includes a thin film transistor TR, an organic light emitting diode OLED, a light blocking layer LS, a gate insulating layer GI, first and second insulating layers ILD1 and ILD2, a bank BNK, and an encapsulating layer EN.

In the thin film transistor TR, a buffer layer buf is disposed on a substrate SUB which is formed of an insulating material such as transparent glass or plastic, and an active layer ACT which is formed of any one of polycrystalline silicon, low-temperature polysilicon, or an oxide semiconductor material is disposed thereon. In this case, when the active layer ACT is formed of any one of polycrystalline silicon, low-temperature polysilicon, or an oxide semiconductor material and is a top-gate type, the light blocking layer LS is disposed below the active layer ACT to block the influence on characteristics of the thin film transistor TR due to external light. The light blocking layer LS may be formed of a low-resistance opaque conductive material which may block the light. For example, the light blocking layer LS may be formed of an aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, the gate insulating layer GI is disposed on the substrate SUB covering the light blocking layer LS and the active layer ACT.

The gate insulating layer GI is a layer for insulating the active layer ACT from the gate electrode GE and may be configured by a single layer or multiple layers of an insulating material, for example, a silicon nitride layer SiNx or a silicon oxide layer SiO2, but is not limited thereto. The gate electrode GE is disposed on the gate insulating layer GI.

The gate electrode GE is disposed above the active layer ACT disposed below. The gate electrode GE may be formed of a low resistance opaque conductive material. For example, the gate electrode GE may be formed of an aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, a first insulating layer ILD1 which is formed of an insulating material is disposed on the gate electrode GE.

A source electrode SE and a drain electrode DE which is spaced apart from the source electrode SE are disposed on the first insulating layer ILD1. The source electrode SE and the drain electrode DE are electrically connected to the active layer ACT through contact holes formed in the gate insulating layer GI and the first insulating layer ILD1. For example, the source electrode SE and the drain electrode DE may be formed of an aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, the thin film transistor TR including the active layer ACT, the gate electrode GE, the source electrode SE, and the drain electrode DE is disposed on the substrate SUB.

The second insulating layer ILD2 formed of an insulating material is disposed on the source electrode SE, and the drain electrode DE and a planarization layer PAC is disposed on the second insulating layer ILD2. The planarization layer PAC may be formed of an organic insulating material, for example, an organic material which may planarize an upper surface, such as polyimide. A first electrode E1 and a bank BNK are disposed on the planarization layer PAC.

The first electrode E1 may be an anode and is electrically connected to the drain electrode DE through contact holes formed on the second insulating layer ILD2 and the planarization layer PAC. Even though not illustrated, a reflective layer may be further disposed below the first electrode E1.

The bank BNK may be disposed to cover a part of both sides of the first electrode E1 and may define an emission area where an organic light emitting layer EML is disposed to emit light. That is, the bank BNK is formed of an insulating material, and the organic light emitting layer EML is disposed in an opening of the bank BNK to emit light. The organic light emitting layer EML is disposed on the first electrode E1 which is partially exposed by the bank BNK.

The organic light emitting layer EML may include a hole injection layer, a hole transport layer, a light emitting layer, an electron transport layer, and an electron injection layer. A second electrode E2 is disposed above the organic light emitting layer EML and the bank BNK.

The second electrode E2 may be a cathode and may be formed of a transparent conductive material. For example, the transparent conductive material may consist of tin oxide (TO), indium tin oxide (ITO), indium zinc oxide (IZO), or indium zinc tin oxide (ITZO), but is not limited thereto. Such a second electrode E2 may form the organic light emitting diode OLED together with the first electrode E1 and the organic light emitting layer EML.

The encapsulating layer EN is disposed above the organic light emitting diode OLED so as to protect the organic light emitting diode OLED and suppress foreign substances which may be generated from the outside or during the process from entering the organic light emitting diode OLED. The encapsulating layer EN may have a structure in which a plurality of inorganic layers and a plurality of organic layers are alternately disposed.

A structure of the notch area NTA will be described in more detail as follows.

Figure 6:
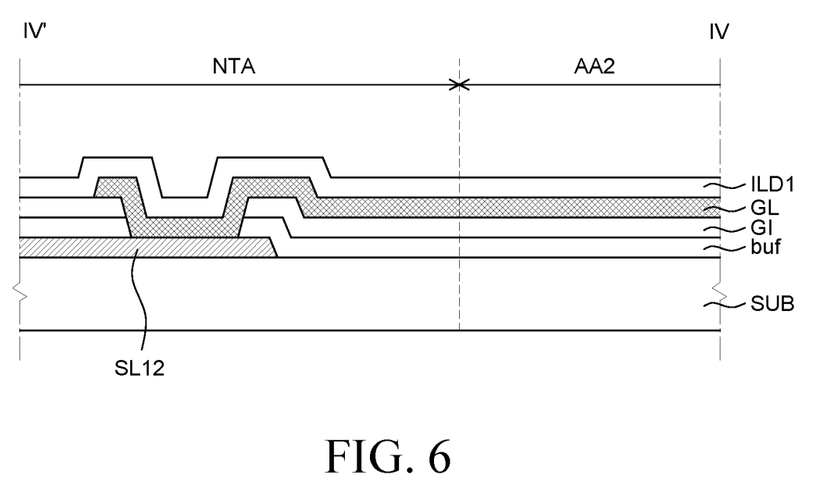
FIG. 6 is a cross-sectional view taken along the line IV-IV' of FIGS. 3A and 3B.

FIG. 6 is a cross-sectional view taken along the line IV-IV' of FIGS. 3A and 3B.

Referring to FIG. 6, in the notch area NTA according to the exemplary embodiment of the present disclosure, a sensing line SL12 is disposed on the substrate SUB. The sensing line SL12 is disposed on the same level as the light blocking layer LS disposed in the display area AA of the pixel structure of FIG. 5 and may be formed of the same material. For example, the sensing line SL12 may be formed of the low resistance opaque conductive material. For example, the sensing line may be formed of aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, the sensing line SL12 of the display device 100 according to the exemplary embodiment of the present disclosure is formed when the light blocking layer LS of the pixel of the display area AA is formed with the same material as the light blocking layer LS so that the sensing line SL12 may be formed without adding a mask. The buffer layer buf and the gate insulating layer GI are disposed on the sensing line SL12.

As described above, the buffer layer buf and the gate insulating layer GI may be formed of an insulating material, and a contact hole in the buffer layer buf and the gate insulating layer GI through which the sensing line SL12 and the gate line GL are electrically connected may be formed. The gate line GL which extends from the second display area AA2 is disposed on the gate insulating layer GI.

The gate line GL is routed to be connected to the sensing line SL through the contact holes formed in the buffer layer buf and the gate insulating layer GI in the notch area NTA. Therefore, the load amount of the scan output signal output from the gate line GL may be transmitted to the load detecting unit 132 by the sensing line SL. A first insulating layer ILD1 is disposed on the gate line GL and the gate insulating layer GI.

As described above, the scan load signal SLS is transmitted to the load detecting unit 132 through a sensing line SL routed to be connected to the gate line GL, and the load detecting unit 132 quantifies the scan load based on the transmitted scan load signal SLS so that the offset of the data signal is corrected by the data driver 121. Such a load detecting unit 132 will be described in more detail with reference to FIG. 7.

Figure 7:
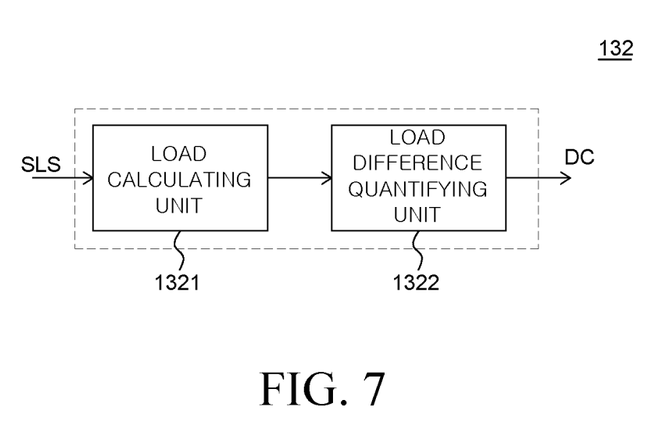
FIG. 7 is a block diagram illustrating a detailed structure of a load detecting unit of FIG. 2.
Figure 8:
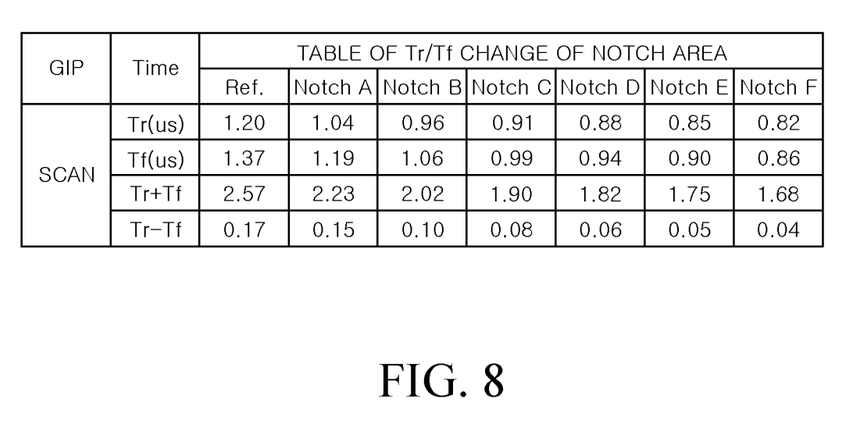
FIG. 8 is a table illustrating a rising time and a falling time due to a load difference of a gate line due to a notch area of a display device according to an exemplary embodiment of the present disclosure.
Figure 9:
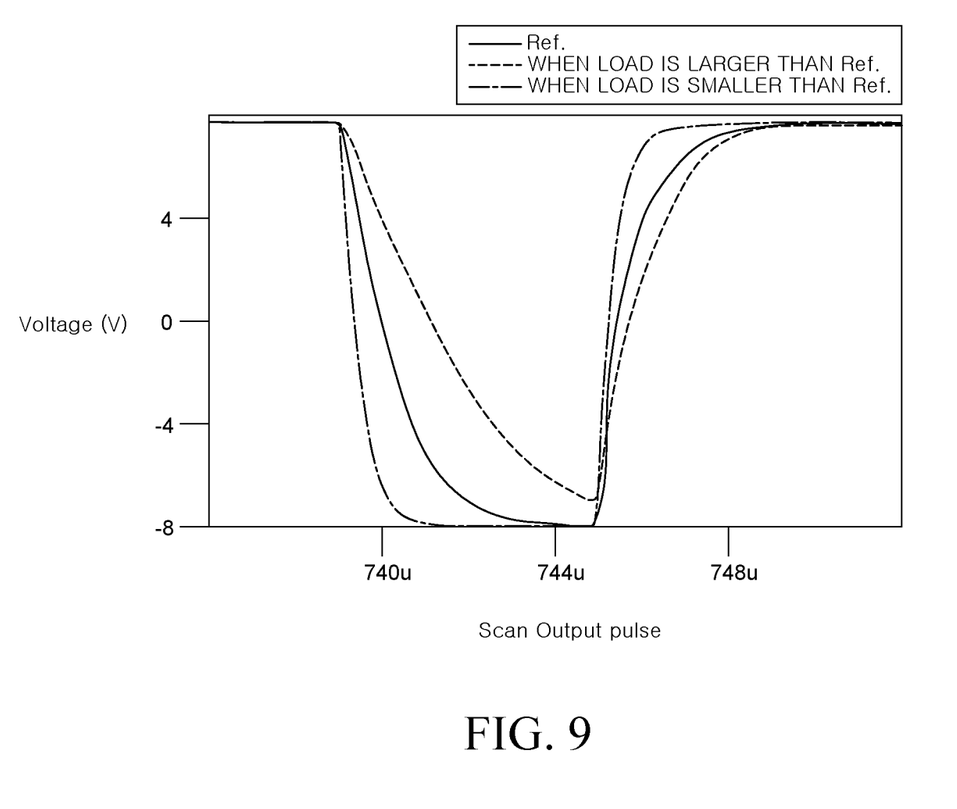
FIG. 9 is a diagram for explaining a method of correcting an offset of a data signal of a data driver according to an exemplary embodiment of the present disclosure.

FIG. 7 is a block diagram illustrating a detailed structure of a load detecting unit of FIG. 2. FIG. 8 is a table illustrating a rising time and a falling time due to a load difference of a gate line due to a notch area of a display device according to an exemplary embodiment of the present disclosure. FIG. 9 is a diagram for explaining a method of correcting an offset of a data signal of a data driver according to an exemplary embodiment of the present disclosure.

Referring to FIG. 7, the load detecting unit 132 includes a load calculating unit 1321 and a load difference quantifying unit 1322.

The load calculating unit 1321 receives the scan output signal SLS output from the plurality of gate lines GL of the second display area AA2 through the plurality of sensing lines SL disposed in the notch area NTA to quantify a load amount of the scan output signal. More specifically, the load calculating unit 1321 may calculate the load amount through a rising time and a falling time of the scan output signal output from a pixel corresponding to the gate signal which is output from the gate line GL. Generally, the shorter the length of the gate line GL, the shorter the rising time and the falling time of the scan output signal.

The load difference quantifying unit 1322 may quantify the load difference based on the rising time and the falling time calculated in the load calculating unit 1321. Here, the load difference may be a difference between the rising time and the falling time.

FIG. 8 illustrates the rising time Tr and the falling time Tf of the gate line of the second display area AA2 due to the formation of the notch area NTA. More specifically, the rising time Tr and the falling time Tf of each gate line or each pixel in the second display area AA2 are illustrated. For example, if the notch A represents the rising time Tr and the falling time Tf of a scan output signal SCAN of any one pixel, it is considered that the notch B represents the rising time Tr and the falling time Tf of a scan output signal output from a pixel adjacent to the any one pixel of notch A. As described above, a difference between the rising time and the falling time of the scan output signal output from each pixel may be represented by the graph illustrated in FIG. 9.

The quantified value which is output as the data compensating value DC is input to the data driver 121.

The data driver 121 adjusts a data gamma curve of a data signal which is generated in accordance with the data driving control signal DCS from the timing controller 131 based on the load difference DC quantified in the load difference quantifying unit 1322 to correct the offset of the data signal. More specifically, the data driver 121 compares the load difference quantified in the load difference quantifying unit 1322 with a predetermined reference value to correct the offset of the data signal.

Referring to FIG. 9, the x-axis represents the quantified load difference outputted from the different pixels, and the Y-axis represents the data voltage applied to the pixel having the different quantified load difference. When the quantified load difference output from the load difference quantifying unit 1322 is larger than the predetermined value Ref., the data driver 121 corrects the offset of the data signal so as to apply a data voltage which is higher than the data voltage set based on the data control signal applied from the timing controller 131. When the quantified load difference output from the load difference quantifying unit 1322 is smaller than the predetermined value Ref., the data driver 121 corrects the offset of the data signal so as to apply a data voltage which is lower than the data voltage set based on the data control signal applied from the timing controller 131.

Therefore, the display device 100 according to an exemplary embodiment of the present disclosure disposes a plurality of sensing lines SL to transmit a detected load amount of the scan output signal of a second display area AA2 having an irregularly shaped side in the notch area NTA and corrects the offset of the data signal output from the data driver 121 based on the load amount of the scan output signal of the second display area AA2 transmitted through the plurality of sensing lines SL. Therefore, the image quality of the display device having an irregularly shaped side may be improved.

The exemplary embodiments of the present disclosure can also be described as follows:

According to an aspect of the present disclosure, a display device may include a substrate including a display area which has an irregularly shaped side and a non-display area which includes a notch area defined by a shape of the irregularly shaped side of the display area and is disposed to enclose the display area, a plurality of gate lines which is divided to be disposed in a left display area and a right display area due to the irregularly shaped side of the display area, a plurality of data lines disposed in the display area, and a plurality of sensing lines in the notch area connected to the plurality of gate lines to transmit a scan output signal output from the plurality of gate lines.

The irregularly shaped side may be disposed to correspond to a short side of the display area and form a concave shape toward an inward direction of the display area.

The plurality of sensing lines may be disposed to be closer to the substrate than the plurality of gate lines.

The plurality of sensing lines may be disposed on the same layer as a light blocking layer disposed on the substrate in the display area and may be formed of the same material as the light blocking layer.

The plurality of gate lines may extend to the notch area.

The plurality of gate lines may be routed to be connected to the plurality of sensing lines in the notch area.

The display device may further include a load detecting unit detecting a scan load difference of the display area due to the shape of the irregularly shaped side based on the scan output signal transmitted from the plurality of sensing lines and a data driver correcting an offset of a data signal based on the scan load difference detected by the load detecting unit and outputting the offset to the plurality of data lines.

According to an another aspect of the present disclosure, a display device may include a display panel including a display area with a plurality of pixels to display images and a non-display area disposed to enclose the display area, wherein the display area may include a plurality of gate lines extending in a first direction and having different lengths and a plurality of data lines extending in a second direction which is different from the first direction, a load detecting unit which detects a scan load amount due to a length difference of the gate lines and quantifies and outputs the scan load amount, and a data driver which corrects and outputs an offset of the data signal applied to the plurality of data lines based on an output value output from the load detecting unit.

The load detecting unit may include a load calculating unit calculating a load of a scan output signal of the display area based on a plurality of scan output signals output from the display area and a load difference quantifying unit quantifying the scan load amount difference based on the load of the scan output signal calculated by the load calculating unit.

The load calculating unit may calculate a load of each scan output signal based on a rising time and a falling time of each of the plurality of scan output signals.

The data driver may correct the offset of the data signal by adjusting a data gamma curve.

When the quantified scan load amount difference output from the load difference quantifying unit is larger than a predetermined value, the data driver corrects the offset of the data signal so as to apply a data voltage which is higher than the data voltage set based on the data control signal applied from the timing controller and when the quantified scan load amount difference output from the load difference quantifying unit is smaller than the predetermined value, the data driver corrects the offset of the data signal so as to apply a data voltage which is lower than the data voltage set based on the data control signal applied from the timing controller.

The display panel may include a display area having an irregularly shaped side and a non-display area including an irregularly shaped area due to the irregularly shaped side of the display area.

The plurality of gate lines may have different lengths due to the irregularly shaped side.

A length of a gate line disposed in the display area in which the irregularly shaped side is formed may be shorter than a length of a gate line disposed in the display area in which the irregularly shaped side is not formed.

The display device may further include a plurality of sensing lines which connects the gate lines disposed in the display area in which the irregularly shaped side is formed to the load detecting unit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only, but are not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate including a display area which has an irregularly shaped side and a non-display area which includes a notch area defined by a shape of the irregularly shaped side of the display area and is disposed to enclose the display area;
    a plurality of gate lines divided to be disposed in a left display area and a right display area due to the irregularly shaped side of the display area;
    a plurality of data lines in the display area; and
    a plurality of sensing lines disposed in the notch area and connected to the plurality of gate lines to transmit a scan output signal output from the plurality of gate lines;
    a load detecting unit detecting a scan load difference of the display area due to the shape of the irregularly shaped side based on the scan output signal transmitted from the plurality of sensing lines; and
    a data driver correcting an offset of a data signal based on the scan load difference detected by the load detecting unit and outputting the offset to the plurality of data lines,
    wherein when a quantified scan load amount difference outputted from a load difference quantifying unit is larger than a predetermined value, the data driver corrects the offset of the data signal so as to apply a data voltage which is higher than the data voltage set based on a data control signal applied from a timing controller, and when the quantified scan load amount difference outputted from the load difference quantifying unit is smaller than the predetermined value, the data driver corrects the offset of the data signal so as to apply a data voltage which is lower than the data voltage set based on the data control signal applied from the timing controller.

2. The display device according to claim 1, wherein the irregularly shaped side is disposed to correspond to a short side of the display area and forms a concave shape toward an inward direction of the display area.

3. The display device according to claim 2, wherein the plurality of sensing lines are disposed to be closer to the substrate than the plurality of gate lines.

4. The display device according to claim 3, wherein the plurality of sensing lines are disposed on a same layer as a light blocking layer disposed on the substrate in the display area and are formed of a same material as the light blocking layer.

5. The display device according to claim 3, wherein the plurality of gate lines extend to the notch area.

6. The display device according to claim 5, wherein the plurality of gate lines are routed to be connected to the plurality of sensing lines in the notch area.

7. A display device, comprising:
    a display panel including a display area with a plurality of pixels for displaying images and a non-display area surrounding the display area, wherein the display area includes a plurality of gate lines extending in a first direction and having different lengths and a plurality of data lines extending in a second direction which is different from the first direction;
    a load detecting unit configured to detect a scan load amount due to a length difference of the gate lines, the load detecting unit further configured to quantify and output the scan load amount; and
    a data driver configured to correct and output an offset of a data signal applied to the plurality of data lines based on an output value output from the load detecting unit;
    wherein when a quantified scan load amount difference outputted from a load difference quantifying unit is larger than a predetermined value, the data driver corrects the offset of the data signal so as to apply a data voltage which is higher than the data voltage set based on a data control signal applied from a timing controller, and when the quantified scan load amount difference outputted from the load difference quantifying unit is smaller than the predetermined value, the data driver corrects the offset of the data signal so as to apply a data voltage which is lower than the data voltage set based on the data control signal applied from the timing controller.

8. The display device according to claim 7, wherein
    the load detecting unit includes a load calculating unit configured to calculate a load of a scan output signal of the display area based on a plurality of scan output signals output from the display area; and
    a load difference quantifying unit configured to quantify the scan load amount difference based on the load of the scan output signal calculated by the load calculating unit.

9. The display device according to claim 8, wherein the load calculating unit is configured to calculate a load of each scan output signal based on a rising time and a falling time of each of the plurality of scan output signals.

10. The display device according to claim 7, wherein the data driver is configured to correct the offset of the data signal by adjusting a data gamma curve.

11. The display device according to claim 7, wherein the display panel includes a display area having an irregularly shaped side and the non-display area including an irregularly shaped area due to the irregularly shaped side of the display area.

12. The display device according to claim 11, wherein the plurality of gate lines has different lengths due to the irregularly shaped side.

13. The display device according to claim 12, wherein a length of a gate line disposed in the display area in which the irregularly shaped side is formed is shorter than a length of a gate line disposed in the display area in which the irregularly shaped side is not formed.

14. The display device according to claim 13, further comprising:
   a plurality of sensing lines which connects the gate lines disposed in the display area in which the irregularly shaped side is formed to the load detecting unit.

* * * * *